United States Patent
Nakagaki et al.

(10) Patent No.: US 12,347,999 B2
(45) Date of Patent: Jul. 1, 2025

(54) METHOD FOR MANUFACTURING LASER PACKAGE

(71) Applicant: NICHIA CORPORATION, Anan (JP)

(72) Inventors: Masatoshi Nakagaki, Komatsushima (JP); Kazuma Kozuru, Tokushima (JP); Eiichiro Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 519 days.

(21) Appl. No.: 17/900,544

(22) Filed: Aug. 31, 2022

(65) Prior Publication Data

US 2022/0416500 A1 Dec. 29, 2022

Related U.S. Application Data

(63) Continuation of application No. 15/854,528, filed on Dec. 26, 2017, now abandoned.

(30) Foreign Application Priority Data

Dec. 27, 2016 (JP) .................................. 2016-253469

(51) Int. Cl.
*H01S 5/0237* (2021.01)
*B23K 1/00* (2006.01)
(Continued)

(52) U.S. Cl.
CPC .......... *H01S 5/0237* (2021.01); *B23K 1/0016* (2013.01); *H01S 5/02255* (2021.01);
(Continued)

(58) Field of Classification Search
CPC .................................................... H01S 5/0235
See application file for complete search history.

(56) References Cited

U.S. PATENT DOCUMENTS 9,450,377 B1  9/2016  Roff et al.
10,355,442 B2 *  7/2019  Fujimura .............. H01S 5/0235
(Continued)

FOREIGN PATENT DOCUMENTS

DE  10 2016 103 862 A1  9/2017
JP  05013820 A *  1/1993  ............. H01L 24/32
(Continued)

OTHER PUBLICATIONS

Non-Final Office Action dated Sep. 15, 2022 in U.S. Appl. No. 15/854,528.

(Continued)

*Primary Examiner* — David A Zarneke
(74) *Attorney, Agent, or Firm* — Foley & Lardner LLP

(57) ABSTRACT

A laser package includes: a substrate having an upper surface; a first laser element disposed on the substrate and configured to emit light in a first direction; a first optical member having a lower surface bonded to the upper surface of the substrate, a reflecting surface inclined relative to the lower surface and configured to reflect the light, and an upper surface connected to the reflecting surface, the upper surface of the first optical member being located farther in the first direction than the reflecting surface; and a bonding material disposed on the upper surface of the substrate. The first optical member is bonded to the substrate via the bonding material. In a top view, a portion of the bonding material protrudes from three sides of the upper surface of the first optical member.

10 Claims, 7 Drawing Sheets

(51) Int. Cl.
  *H01S 5/02255* (2021.01)
  *H01S 5/18* (2021.01)
  *H01S 5/40* (2006.01)

(52) U.S. Cl.
  CPC .............. *H01S 5/18* (2013.01); *H01S 5/4025* (2013.01); *H01S 5/4031* (2013.01)

(56) References Cited

U.S. PATENT DOCUMENTS

| | | |
|---|---|---|
| 2001/0003049 A1 | 6/2001 | Fukasawa et al. |
| 2005/0169570 A1 | 8/2005 | Kim et al. |
| 2006/0226432 A1 | 10/2006 | Nemoto |
| 2007/0217476 A1 | 9/2007 | Yoshikawa et al. |
| 2007/0228105 A1 | 10/2007 | Oshika et al. |
| 2008/0013584 A1 | 1/2008 | Freund |
| 2009/0294789 A1 | 12/2009 | Yoshida |
| 2013/0081759 A1 | 4/2013 | Endoh et al. |
| 2013/0250520 A1 | 9/2013 | Taniguchi |
| 2015/0130085 A1 | 5/2015 | Hino |
| 2016/0240999 A1* | 8/2016 | Barbarossa ......... H01S 5/02326 |
| 2017/0288366 A1* | 10/2017 | Hazeghi ................ H01S 5/0235 |
| 2019/0089125 A1 | 3/2019 | Eichler et al. |

FOREIGN PATENT DOCUMENTS

| | | | |
|---|---|---|---|
| JP | 2000236034 A | * | 8/2000 |
| JP | 2000260915 A | * | 9/2000 |
| JP | 2001-272582 A | | 10/2001 |
| JP | 2004-107728 A | | 4/2004 |
| JP | 2007-013002 A | | 1/2007 |
| JP | 2010206090 A | * | 9/2010 |
| JP | 2012-054358 A | | 3/2012 |
| JP | 2013-239614 A | | 11/2013 |
| JP | 2015-056550 A | | 3/2015 |
| JP | 2015-095540 A | | 5/2015 |
| JP | 2015-109434 A | | 6/2015 |
| JP | 2015-228401 A | | 12/2015 |
| WO | WO-2011/155055 A1 | | 12/2011 |
| WO | WO-2015/114761 A1 | | 8/2015 |

OTHER PUBLICATIONS

Final Office Action in U.S. Appl. No. 15/854,528 dated Mar. 21, 2023.
Final Office Action in U.S. Appl. No. 15/854,528 dated Feb. 11, 2021.
Final Office Action in U.S. Appl. No. 15/854,528 dated May 10, 2022.
Non-Final Office Action in U.S. Appl. No. 15/854,528 dated Aug. 20, 2020.
Non-Final Office Action in U.S. Appl. No. 15/854,528 dated Dec. 17, 2021.

* cited by examiner

METHOD FOR MANUFACTURING LASER PACKAGE

CROSS-REFERENCE TO RELATED PATENT APPLICATION

The present application is a continuation of U.S. patent application Ser. No. 15/854,528 filed Dec. 26, 2017, which claims priority under 35 U. S. C. § 119 to Japanese Patent Application No. 2016-253469 filed Dec. 27, 2016. The contents of these applications are incorporated herein by reference in their entireties.

BACKGROUND

The present disclosure relates to a method of manufacturing a laser package.

A method of using a solder material to bond a plurality of laser devices each having a submount and a laser element disposed on the submount onto a substrate has been known. In such method, the solder material is disposed on the upper surface of the substrate at locations for placing the laser devices, and the laser devices are then placed on the disposed solder materials. Subsequently, heat is applied while pressing the laser devices to bond the laser devices to the substrate (see for example, Japanese Unexamined Patent Application Publication No. 2007-13002).

SUMMARY

However, the method of mounting a laser device described in Japanese Unexamined Patent Application Publication No. 2007-13002 has room for further improvements in accurately mounting the laser device while reducing damage to the laser device.

Accordingly, a method of manufacturing a laser package includes: providing a plurality of laser devices, each including: a submount, and an edge-emitting semiconductor laser element disposed on the submount; providing one or more optical members; providing a substrate having an upper surface and disposing a first bonding material containing metal nanoparticles or metal sub-micron particles and one or more organic solvent on the upper surface of the substrate at locations at which the plurality of laser devices are to be placed, and disposing a second bonding material containing metal nanoparticles or metal sub-micron particles and one or more organic solvent on the upper surface of the substrate at locations at which the one or more optical members are to be placed; placing the plurality of laser devices on the upper surface of the substrate via the first bonding material, and placing the one or more optical members on the upper surface of the substrate via the second bonding material; and collectively heating the plurality of laser devices and the one or more optical members on the substrate without pressing the plurality of laser devices and the one or more optical members onto the substrate, so as to bond the plurality of laser devices and the one or more optical members to the substrate via the first and second bonding materials.

Thus, it is possible to manufacture a laser package with a laser device placed with high placing accuracy while reducing damage to a laser element.

DETAILED DESCRIPTION OF EMBODIMENTS

Figure 1A:
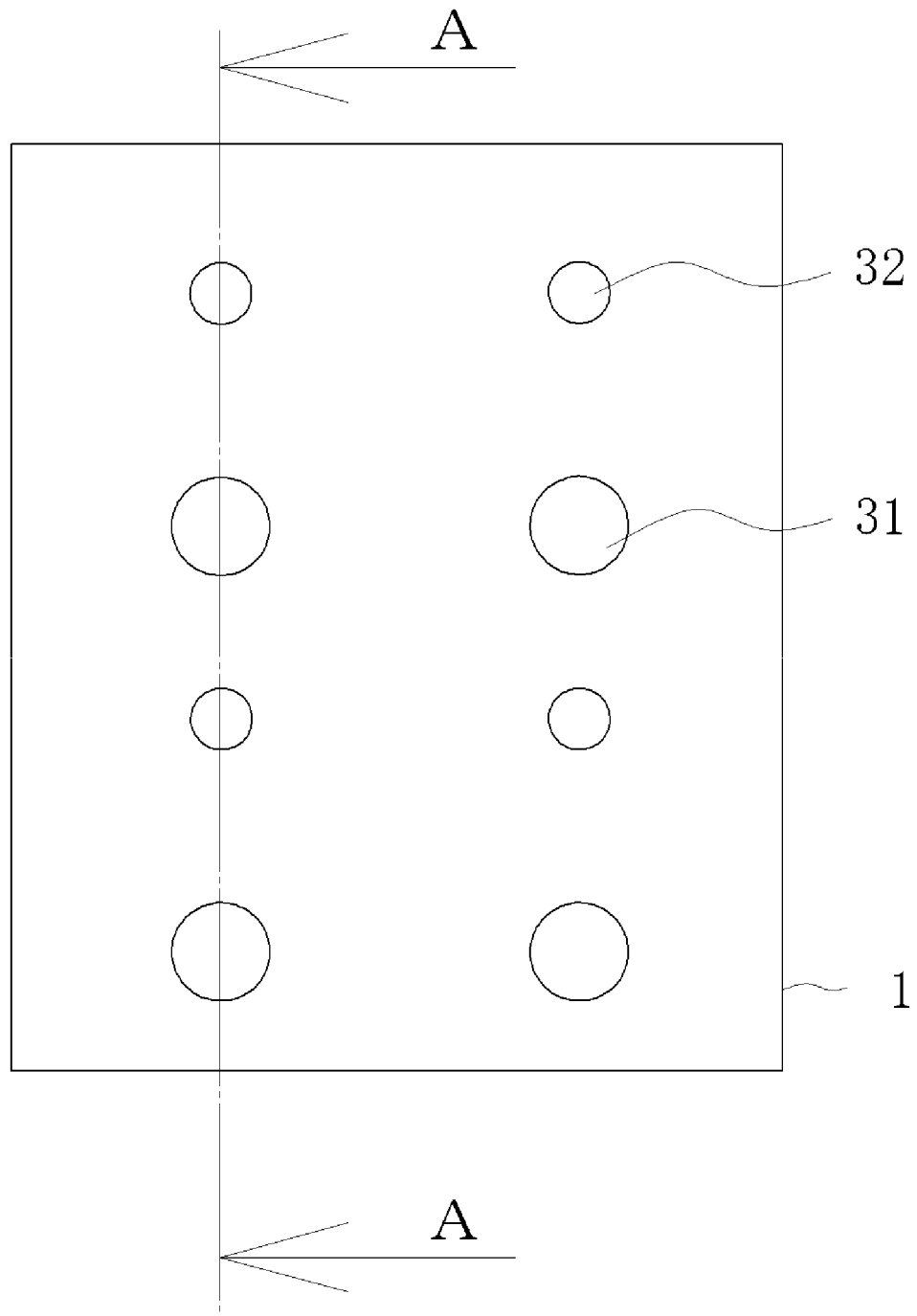
FIG. 1A is a schematic plan view illustrating a method of manufacturing a laser package according to one embodiment of the present disclosure.

Certain embodiments of the present invention will be described below with reference to the drawings. The embodiments shown below are intended as illustrative to give a concrete form to technical ideas of the present invention, and the scope of the invention is not limited to those described below. In the description below, the same designations or the same reference numerals denote the same or similar members and duplicative descriptions will be appropriately omitted.

Figure 1B:
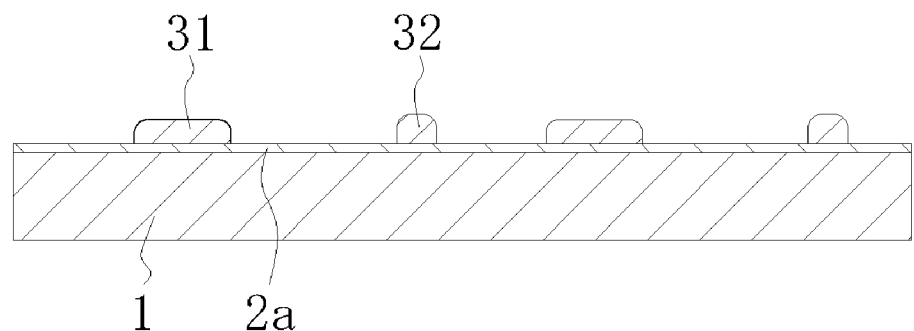
FIG. 1B is a schematic cross sectional view taken along line 1B-1B of FIG. 1A.
Figure 2A:
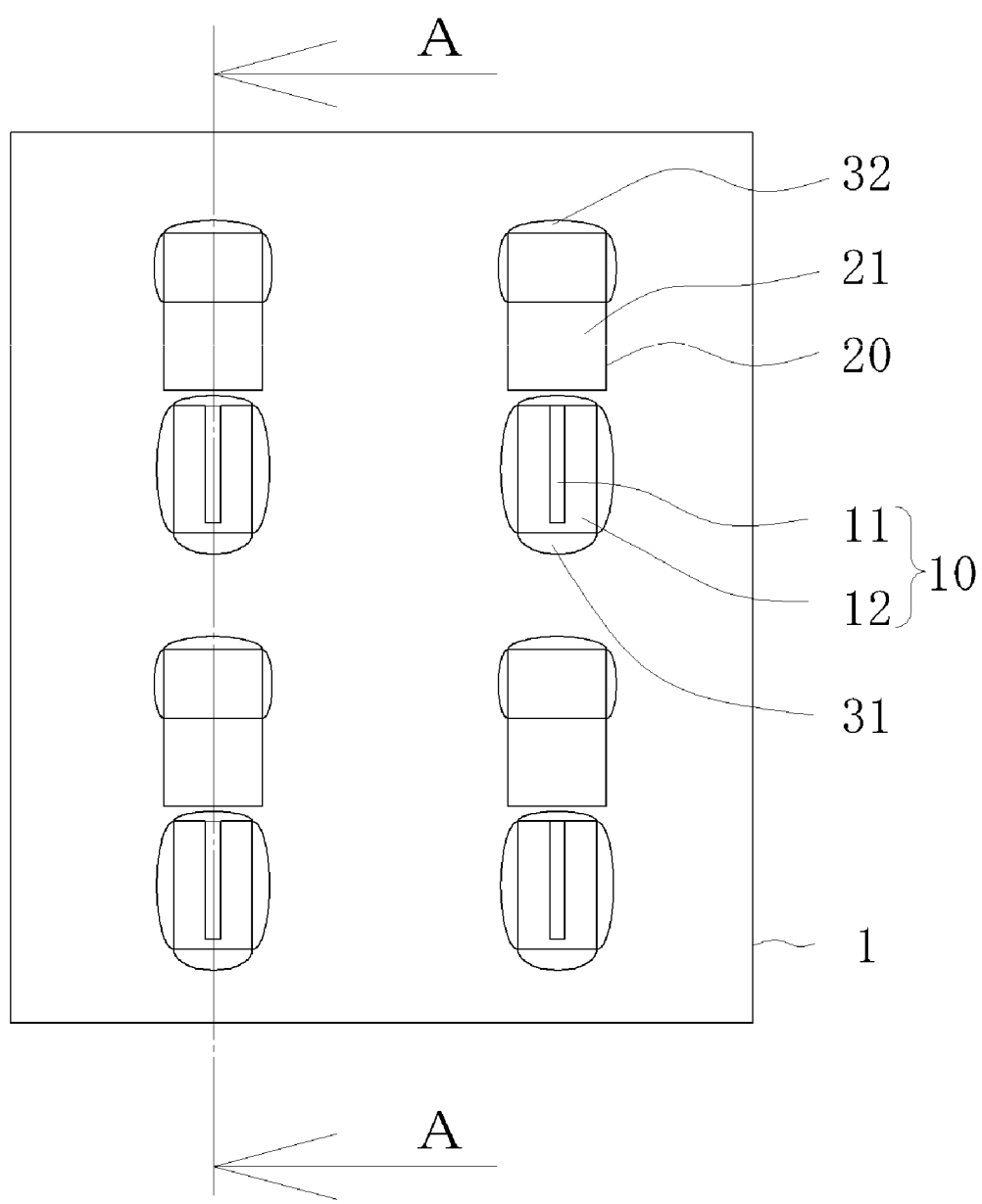
FIG. 2A is a schematic plan view illustrating a method of manufacturing a laser package according to one embodiment of the present disclosure.
Figure 2B:
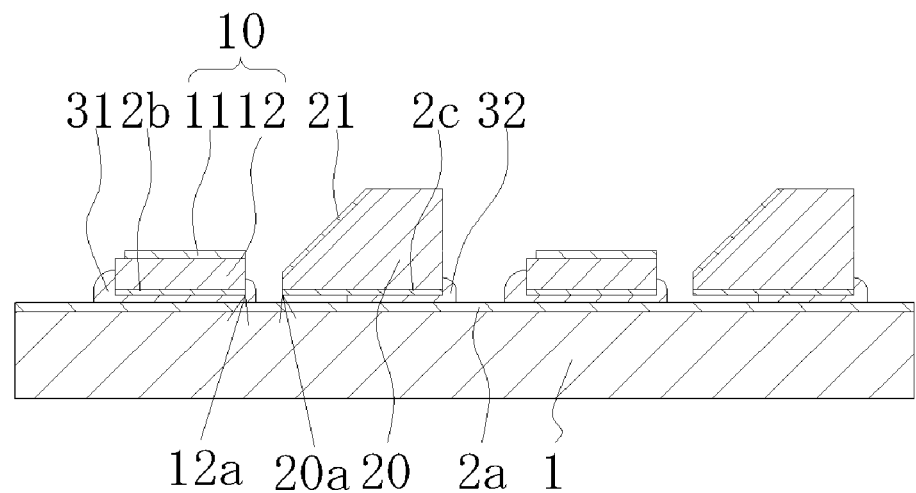
FIG. 2B is a schematic cross sectional view taken along line 2B-2B of FIG. 2A.
Figure 4:
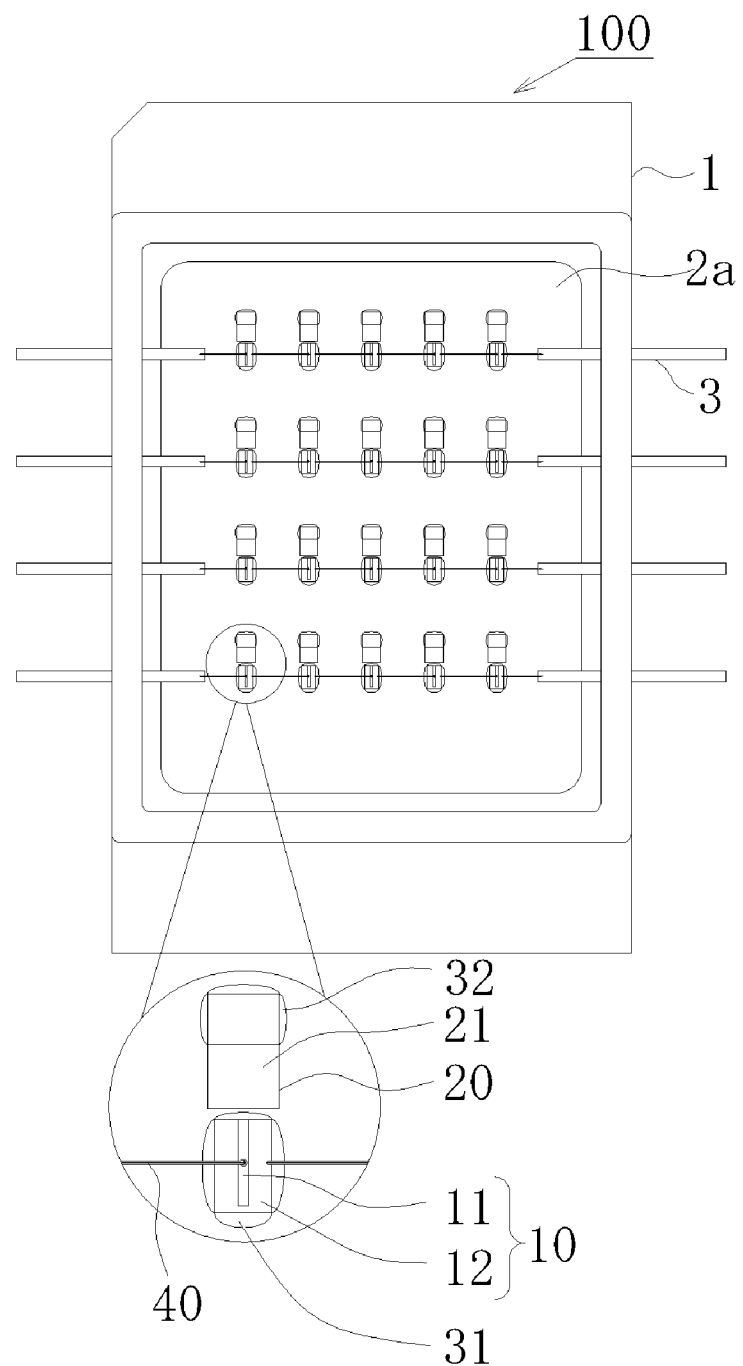
FIG. 4 is a schematic plan view of a laser package according to one embodiment of the present disclosure.

In a method of manufacturing a laser package 100 according to certain embodiments, a plurality of laser devices 10, each including a submount 12 and an edge-emitting semiconductor laser element 11 disposed on the submount 12 are provided, and one or more optical members 20 are provided. A substrate 1 having an upper surface is provided, and as shown in FIG. 1A and FIG. 1B, a first bonding material 31 containing metal nanoparticles or metal sub-micron particles and one or more organic solvent is disposed on the upper surface of the substrate at locations at which the plurality of laser devices 10 are to be placed. Also, a second bonding material 32 containing metal nanoparticles or metal sub-micron particles and one or more organic solvent is disposed on the upper surface of the substrate 1 at locations at which the one or more optical members 20 are to be placed. In the present disclosure, the term "metal nanoparticles" refers to metal particles having an average particle size in a range of 1 nm to 100 nm, and the term "metal submicron particles" refers to metal particles having an average particle size in a range of 101 nm to 1 µm. Average particle size can be determined, for example, by using a projected image produced by a transmission electron microscope (TEM), randomly measuring projected area-circle equivalent diameters of 100 metal nanoparticles or metal submicron particles, and calculating the average value. Further, for ease of explanation, in FIG. 1A and FIG. 1B, a region of the substrate 1 including four locations for disposing droplets of the first bonding material 31 and four locations for disposing droplets of the second bonding material 32 is illustrated. The above also applies to FIG. 2A and FIG. 2B. Subsequently, as shown in FIG. 2A and FIG. 2B, on the upper surface of the substrate 1, the laser devices 10 are placed via the first bonding material 31 and the optical members 20 are placed via the second bonding material 32 respectively. Then, heat is collectively applied to the laser devices 10 and the optical members 20 on the substrate 1 without pressing the plurality of laser devices 10 and the one or more optical members 20 onto the substrate 1, so as to bond the plurality of laser devices 10 and the one or more optical members 20 onto the substrate via the first bonding material 31 and second bonding material 32. Thus, a laser package 100 as shown in FIG. 4 is obtained. Applying heat allows the organic solvent contained in the first bonding material 31 and the second bonding material 32 to vaporize. Thus, the plurality of laser devices 10 and one or more optical member 32 are bonded to the substrate 1 mainly via the metal nanoparticles or the metal submicron particles.

If a solder material such as AuSn is used for the material to bond the laser devices 10 and the optical members 20 to the substrate 1, because the solder is melted by heat to create a bond, when the heat is applied without pressing the laser devices 10 and the optical members 20 onto the substrate 1, the bonding position may shift. Further, regardless of the use of a solder material, when a plurality of laser devices 10 and the optical devices 20 are bonded onto a single substrate 1, if all of the components are collectively pressed to the substrate 1, uneven pressure may be applied to each component due to differences in heights between the laser devices 10 and the optical members 20, and/or differences in sizes between the laser elements 11 and the submounts 12, which may result in positional errors in the bonding position of each component. To avoid such positional errors, pressing each one of the laser devices 10 and each one of the optical members 20 one by one while heating may be repeated for the total number of components. When this is carried out, occurrence of positional errors can be reduced, but the increased number of times that heating is performed may cause large damage to the laser elements 11.

Thus, according to certain embodiments of the present disclosure, pressure is not applied while heating, and further, for the first bonding material 31 and the second bonding material 32, a bonding material that contains metal nanoparticles or metal sub-micron particles and one or more organic solvent is used. Pressure is not applied while heating, so that application of uneven pressure to the laser devices 10 and the optical members 20 is avoided, and thus positional error in the bonding position due to pressing can be prevented. Moreover, when the first bonding material 31 and the second bonding material 32 are heated, vaporization of the organic solvent occurs instead of melting, so that spreading during the heating is smaller than that of a solder material. Accordingly, bonding positions are less likely to shift even without pressing the laser devices 10 and the optical members 20 while heating. As described above, according to the method of manufacturing according to certain embodiments, a plurality of laser devices 10 and the optical members 20 can be bonded to the substrate 1 with high positional accuracy. Further, according to the method of manufacturing according to certain embodiments, a plurality of laser devices 10 can be bonded to the substrate 1 with a single heating operation, so that damage to the laser elements 11 can be reduced.

The respective steps will be described below.
Providing Laser Device and Optical Member A plurality of laser devices 10 each having a submount 12 and an edge-emitting semiconductor laser element 11 disposed on the submount 12 are provided, and also one or more optical members 20 are provided. For the laser elements 11, various types of laser elements can be used, but in the certain embodiments, GaN-based semiconductor laser elements are employed. The oscillation wavelength of the GaN-based semiconductor laser elements can be, for example, in a range of 350 nm to 600 nm. The output power of each of the laser elements 11 can be, for example, in a range of 0.5 W to 10 W.

In each of the laser devices 10, the laser element 11 can be junction-down mounted on the submount 12. In the present specification, "junction-down mounting" refers to mounting the laser element 11 on an upper surface of the submount 12 with a main surface of the laser element 11 closer to the active layer of the laser element 11 facing the upper surface of the submount 12. Thus, for example, the laser element 11 is mounted so that the active layer of the laser element 11 is located lower than a half of the thickness of the laser element 11. Accordingly, heat generated in the laser element 11 can be easily dissipated to the submount 12.

For the submount 12, for example, AlN, SiC, or the like can be used. In the laser device 10, AlN is used for the submount 12. The thickness of the submount 12 can be in a range of, for example, 0.2 mm to 0.5 mm. The submount 12 has a lower surface. A side of the lower surface can be in a range of 0.5 mm to 2 mm, and an area of the lower surface can be in a range of 0.25 $mm^2$ to 4 $mm^2$. The ranges shown above are preferable to secure the bonding strength between the laser device 10 and the substrate 1.

The one or more optical members 20 are respectively configured to reflect light from its corresponding laser element 10. The optical members 20 may be made of glass having a shape such as triangular prism shape, a quadrangular truncated cone shape, or the like. Further, as shown in FIG. 2A and FIG. 2B, each of the optical members 20 can be provided with an inclined surface and a reflecting layer 21 may be disposed on the inclined surface so that the inclined surface can be a reflecting surface to reflect light from the laser element 10 in an upward direction. When the optical member 20 is mounted on the upper surface of the substrate 1, the angle between the upper surface of the substrate 1 and the inclined surface of the optical member 20 can be in a range of, for example, 30 degrees to 60 degrees.

One or more optical members 20 may be used. In the laser package 100 illustrated in FIG. 4, lights emitted from the plurality of laser devices 10 are reflected in upward directions by the plurality of optical members 20 each facing corresponding one of the laser devices 10, but lights emitted from two or more laser devices 10 may be reflected by a single optical member 20.

The optical member 20 has a lower surface. A side of the lower surface can be in a range of 0.3 mm to 2 mm, and an area of the lower surface can be in a range of 0.15 $mm^2$ to 2 $mm^2$. The ranges shown above are preferable to secure the bonding strength between the optical member 20 and the substrate 1.

The lower surfaces of the submounts 12 and the optical members 20 are preferably washed. Dust or the like attached to the lower surfaces can be removed by washing, so that bonding strength between the submount 12 and substrate 1, and between the optical member 20 and substrate 1 can be enhanced. Further, heat-resisting properties of the bonding parts between the submount 12 and the substrate 1, and between the optical member 20 and the substrate 1 can also be improved. Similar effects can be obtained by washing the upper surface of the substrate 1. Washing of the lower surfaces of the submounts 12 and the optical members 20 and/or the upper surface of the substrate 1 can be carried out by, for example, plasma treatment using an atmospheric pressure plasma treatment system, UV ozone washing, or the like. Plasma treatment can be performed by supplying a gas, for example, $O_2$, $H_2O$, Na, Ar, a fluorine-based gas such as $CF_4$ or the like. When the lower surfaces of the submount 12 are washed, washing is preferably carried out before disposing the laser elements 11 on the submounts 12. Thus, for example, when washing the lower surfaces of the submount 12 by using an atmospheric pressure plasma treatment system, plasma-induced damage to the laser elements 11 can be avoided.

Figure 3A:
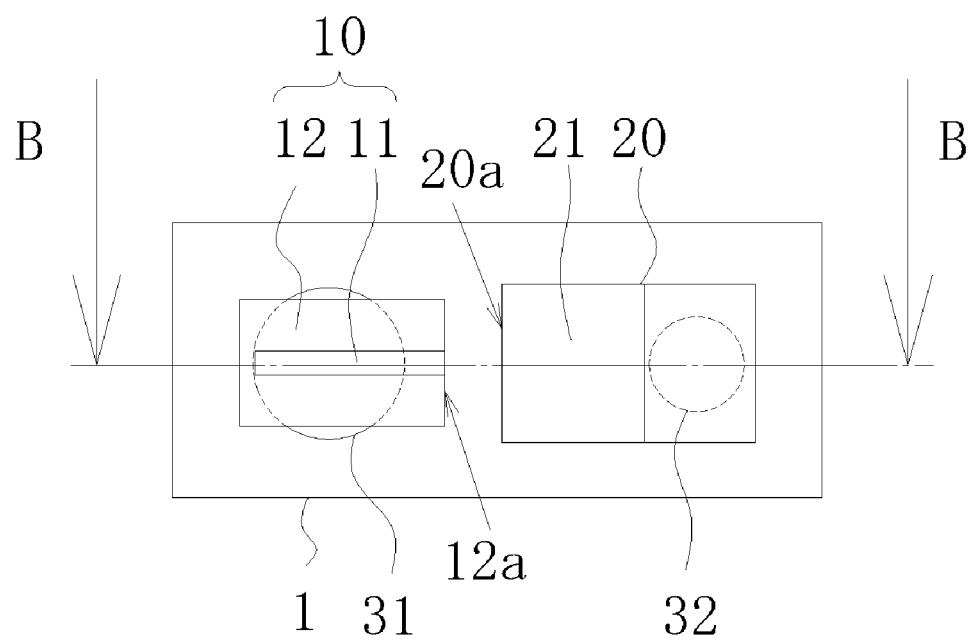
FIG. 3A is a schematic plan view illustrating a method of manufacturing a laser package according to one embodiment of the present disclosure.

As shown in FIG. 2B and other figures of the accompanying drawings, a metal film 2a can be disposed on the upper surface of the substrate 1. As shown in FIG. 3A and other figures of the accompanying drawings, a metal film 2b can be disposed on the lower surface of the submount 12, and a metal film 2c can be disposed on the lower surface of the optical member 20. High bonding strength can be obtained when the metal nanoparticles and metal submicron particles are joined to the same kind of metal. Thus, the metal films 2a, 2b, and 2c are preferably made of the same kind of metal as that of the metal nanoparticles or metal submicron particles. In the laser package 100, Au submicron particles are used for the bonding material. Thus, Au films are disposed on the upper surface of the substrate 1 and the lower surfaces of the submounts 12 and the lower surfaces of the optical members 20. The metal films 2a, 2b, and 2c can be disposed by using sputtering, plating, vapor deposition, or the like. When the metal films 2a, 2b, and 2c are disposed on the upper surface of the substrate 1, the lower surfaces of the submounts 12, and the lower surfaces of the optical members 20, it is preferable to wash the upper surface of the substrate 1, the lower surfaces of the submounts 12, and the lower surfaces of the optical members 20 after the metal films 2a, 2b, and 2c are disposed.

Disposing First Bonding Material and Second Bonding Material

A substrate 1 having an upper surface is provided and as shown in FIG. 1A and FIG. 1B, a first bonding material 31 containing metal nanoparticles or metal sub-micron particles and one or more organic solvent is disposed on the upper surface of the substrate at locations at which the plurality of laser devices 10 are to be placed. Also, a second bonding material 32 containing metal nanoparticles or metal sub-micron particles and one or more organic solvent is disposed on the upper surface of the substrate 1 at locations at which the one or more optical members 20 are to be placed. In the laser package 100, Au submicron particles are used in the first bonding material 31 and the second bonding material 32, but nanoparticles or sub-micron particles of various kinds of metal can also be used. The metal nanoparticles and metal submicron particles can be sintered at lower temperatures as particle sizes become smaller, but the smaller the particle size, the more aggregation of particles tends to occur, which may make the bonding material unsuitable for bonding. However, the first bonding material 31 and the second bonding material 32 contain the organic solvent, so that occurrence of such degree of aggregation can be reduced. Numerous Au submicron particles are used in the first bonding material 31 and the second bonding material 32, and the average particle sizes of those particles are preferably in a range of 101 nm to 0.5 μm. Accordingly, aggregation of Au submicron particles can be avoided and bonding can be facilitated.

The first bonding material 31 and the second bonding material 32 can be applied on the upper surface of the substrate 1 through a dispenser, using a pin-transfer printing technique, or the like.

Before placing the laser devices 10 and the optical members 20 on the first bonding material 31 and the second bonding material 32 that are disposed on the substrate 1, it is preferable to place the first bonding material 31 and the second bonding material 32 disposed on the upper surface of the substrate 1 in a vacuum device and to evacuate the vacuum device. This allows vaporization of a portion of the organic solvent contained in the first bonding material 31 and the second bonding material 32, which can reduce the possibility of a portion of the solvent remaining in the bonding material after heating the first bonding material 31 and the second bonding material 32 in a later step. The temperature in the vacuum device can be in a range of 20° C. to 30° C. When the first bonding material 31 and the second bonding material 32 are respectively disposed with a maximum width, an area, and a thickness in the ranges shown below, the duration of evacuating the vacuuming device can be in a range of 1 minute to 10 minutes, with a degree of vacuum in a range of 1 Pa to 1000 Pa.

When seen from above, each droplet of the first bonding material 31 can be disposed with a maximum width in a range of 0.3 mm to 2 mm before placing the laser device 10. When seen from above, each droplet of the first bonding material 31 can be disposed with an area in a range of 0.09 $mm^2$ to 4 $mm^2$ before placing the laser device 10. Each droplet of the first bonding material 31 can be disposed with a thickness in a range of 50 μm to 1000 μm before placing the laser device 10.

When seen from above, each droplet of the second bonding material 32 can be disposed with a maximum width in a range of 0.1 mm to 1 mm before placing the optical member 20. When seen from above, each droplet of the second bonding material 32 can be disposed with an area in a range of 0.01 $mm^2$ to 1 $mm^2$ before placing the optical member 20. Each droplet of the second bonding material 32 can be disposed with a thickness in a range of 50 μm to 1000 μm before placing the optical member 20.

The heat from the laser element 11 needs to be dissipated to the substrate 1 via the first bonding material 31. Thus, the area of each droplet of the first bonding material 31 before placing the laser device 10 preferably is larger than the area of the lower surface of the submount 12. On the other hand, the necessity for dissipating heat from the optical member 20 is lower than that for the laser device 10. Also, the second bonding material 32 rising up a surface of the optical member 20 facing the laser device 10 needs to be prevented. Thus, the area of each droplet of the second bonding material 32 before placing the optical member 20 preferably is smaller than the area of the lower surface of the optical member 20. Accordingly, in the present embodiment, the ratio of the area of each droplet of the first bonding material 31 before placing the laser device 10 with respect to the area of the lower surface of the submount 12 is greater than the ratio of the area of each droplet of the second bonding material 32 before placing the optical member 20 with respect to the area of the lower surface of the optical member 20. Further, as in the present embodiment, when a single laser device 10 corresponds to a single optical member 20, the area of each droplet of the first bonding material 31 before placing the laser device 10 is preferably larger than the area of each droplet of the second bonding material 32 before placing the optical member 20.

The area of each droplet of the first bonding material 31 before placing the laser device 10 is preferably in a range of 40% to 70% with respect to the area of the lower surface of the submount 12. With the area of 40% or more, when the laser device 10 is placed on the upper surface of the first bonding material 31 in a later step, the lower surface of the submount 12 can be easily made in contact with the first bonding material 31 in an area directly under the laser-light emitting end, which is a part of the laser element 11 which particularly generates heat. This facilitates heat from the laser element 11 to be easily dissipated to the substrate 1 via the submount 12. With the area of 70% or less, when the laser device 10 is placed on the upper surface of the first bonding material 31 in a later step, the occurrence of the first bonding material 31 rising up the laser device 10 close to the laser-light emitting end of the laser device 10 can be reduced.

The area of each droplet of the second bonding material 32 before placing the optical member 20 is preferably in a range of 10% to 30% with respect to the area of the lower surface of the optical member 20. With the area of 10% or more, bonding of the optical member 20 to the substrate 1 in a later step can be facilitated. With the area of 30% or less, when the optical member 20 is placed on the upper surface of the second bonding material 32 in a later step, the occurrence of the second bonding material 32 rising up the surface of the optical member 20 facing the laser device 10 can be reduced.

A position of the first bonding material 31 and the second bonding material 32 after the first bonding material 31 and the second bonding material 32 are disposed on the upper surface of the substrate 1, but before the laser device 10 and the optical member 20 are placed on the first bonding material 31 and the second bonding material 32 is referred to as a "disposed position." When the first bonding material 31 and the second bonding material 32 are in the disposed position, a distance between a droplet of the first bonding material 31 and an adjacent droplet of the second bonding material may be in a range of 0.5 mm to 2 mm. More specifically, the "disposed position" refers to the positions of the first bonding material 31 and the second bonding material 32 shown in FIG. 1A and FIG. 1B.

For the substrate 1, a metal substrate can be used. With a metal substrate, even when a plurality of laser devices 10 are mounted on the substrate 1, heat from the laser elements 11 can be efficiently dissipated. In particular, when the laser element 11 of high output power is employed, a metal substrate having high heat dissipating properties is preferably employed. The term "laser element of high output power" refers to, for example, a laser element with an output of 0.5 W or greater.

Placing Laser Device and Optical Member

Subsequently, as shown in FIG. 2A and FIG. 2B, on the upper surface of the substrate 1, the laser devices 10 are placed via the first bonding material 31 and the optical members 20 are placed via the second bonding material 32, respectively. Accordingly, the first bonding material 31 and the second bonding material 32 are pressed by the laser device 10 or the optical member 20 and spread wider than their disposed areas. That is, after the laser device 10 and the optical member 20 are placed on the first bonding material 31 and the second bonding material 32, the maximum width and the area of the first bonding material 31 and the second bonding material 32 increase compared to when they were disposed on the substrate 1, and the thickness of the first bonding material 31 and the second bonding material 32 decrease compared to when they were disposed on the substrate 1. Accordingly, the interval between the first bonding material 31 and the second bonding material 32 decreases.

Figure 3B:
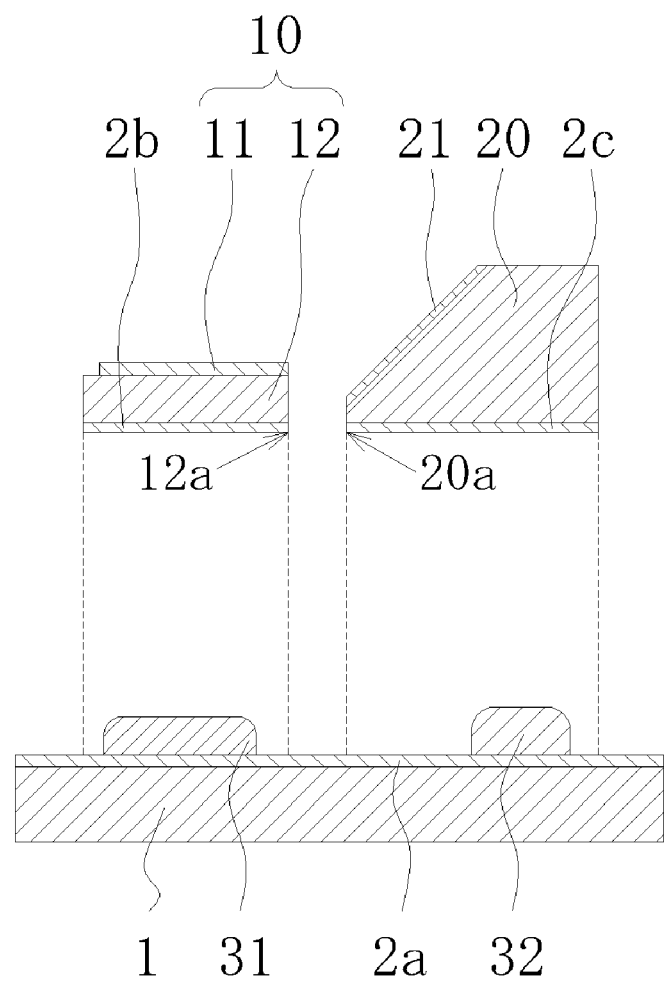
FIG. 3B is a schematic cross sectional view taken along line 3B-3B of FIG. 3A.

As shown in FIG. 3A and FIG. 3B, when seen from above, the laser device 10 is preferably placed on the first bonding material 31 such that an end 12a of the submount 12 that is to face an adjacent optical member 20 is located between the disposed position of the first bonding material 31 and the disposed position of the second bonding material 32. With this arrangement, even if the first bonding material 31 under the submount 12 is spread toward the optical member 20, the occurrence of the first bonding material 31 rising up the laser device 10 close to the light emitting end can be reduced. Accordingly, the possibility of the laser light being blocked by the first bonding material 31 can be reduced. Further, adhesion of the first bonding material 31 to the end 20a of the optical member 20 can be reduced. Also, as shown in FIG. 2A, FIG. 2B, and other figures of the accompanying drawings, the first bonding material 31 may protrude from the end 12a of the submount 12 toward the optical member 20. With this, the lower surface of the submount 12 can be easily made in contact with the first bonding material 31 in an area directly below the laser-light emitting end which is a part of the laser element 11 which particularly generates heat. This facilitates heat from the laser element 11 to be easily dissipated to the substrate 1 via the submount 12. Moreover, the bonding strength between the laser device 10 and the substrate 1 can be enhanced.

A position of the first bonding material 31 and the second bonding material 32 after the laser device 10 and the optical member 20 are placed on the first bonding material 31 and the second bonding material 32 is referred to as a "bonded position." As shown in FIG. 2A and FIG. 2B, when placing each of the laser devices 10 on the substrate 1, the submount 12 is preferably brought in contact with the first bonding material 31 such that an end of the bonded position of the first bonding material 31 facing the adjacent optical member 20 is located between the corresponding laser device 10 and the adjacent optical member 20, when seen from above. More specifically, the "bonding position" refers to the positions of the first bonding material 31 and the second bonding material 32 shown in FIG. 2A and FIG. 2B. The first bonding material 31 is preferably protruded toward but not adhered to the end 20a of the optical member 20. Thus, the first bonding material 31 rising up the optical member 20 can be avoided.

As shown in FIG. 3A and FIG. 3B, when seen from above, each of the optical members 20 are preferably placed on the second bonding material 32 such that an end 20a of the optical member 20 that is to face an adjacent laser device 10 is located between the disposed position of the first bonding material 31 and the disposed position of the second bonding material 32. With this arrangement, even if the second bonding material 32 under the optical member 20 is spread toward the laser device 10, the occurrence of the second bonding material 32 rising up the end 20a of the optical member 20 can be reduced.

As shown in FIG. 2A and FIG. 2B, when placing each of the optical members 20 on the substrate 1, the optical member 20 is preferably brought in contact with the second bonding material 32 such that, when viewed from above, the end 20a of the optical member 20 facing the adjacent laser device 10 is located between the end of the bonded position of the first bonding material 31 and the end of the bonded position of the second material 32, or the end 20a of the optical member facing the adjacent laser device 10 matches the end of the bonded position of the second bonding material 32. Accordingly, the occurrence of the second bonding material 32 rising up the end 20a of the optical member 20 can be reduced.

Reducing adhesion of the first bonding material 31 and the second bonding material 32 to the end 20a of the optical member 20 can reduce absorption of laser light caused by irradiating the first bonding material 31 and the second bonding material 32. In particular, when the laser element 11 is mounted in a junction-down manner, because the region to emit laser light is located lower compared to mounting in a junction-up manner, the possibility of laser light emitted to and in the vicinity of the end 20a of the optical member 20 is relatively high. Thus, reducing adhesion of the bonding material to the end 20a of the optical member 20 allows for reducing the possibility of the laser light absorption by the bonding material, even when the laser element 11 is junction-down mounted.

As described above, in the laser package 100, because the bonded positions of the laser devices 10 and the optical members 20 to the substrate 1 are less likely to shift during heating, the laser devices 10 and corresponding optical devices 20 can be arranged closely compared to the case where a solder material is used for the bonding material. This allows for the spot diameter of the laser light irradiated on the optical member 20 to be relatively small, so that all or almost all the laser light can be reflected by the optical member 20. Accordingly, the light-extracting amount can be improved. Moreover, even if the laser device 10 or the optical member 20 is bonded with a slightly misaligned placement, the laser light emitted from the laser device 10 can be irradiated on the optical member 20. The distance between the end 12a of the submount 12 and the end 20a of the optical member 20 can be in a range of 0.05 mm to 0.2 mm.

When the laser device 10 is placed on the upper surface of the substrate 1, the laser device 10 can be held by a holding member and pressed to the substrate 1 via the first bonding material 31. After the laser device 10 is pressed to the substrate 1, the holding member is separated from the laser device 10. The timing to separate the holding member is before the step of heating the laser devices 10 and the optical members 20 which will be described below. With the pressing, the air entering between the substrate 1 and the laser devices 10 can be reduced, allowing for enhancing the bonding strength between the substrate 1 and the laser devices 10. After the laser devices 10 are placed, the thickness of the first bonding material 31 can be in a range of 0.5 µm to 5 µm, or 0.5 µm to 80 µm.

When the laser device 10 is placed such that the end 12a of the corresponding submount 12 that is to face the adjacent optical member 20 is located between the disposed position of the first bonding material 31 and the disposed position of the second bonding material 32, a distance between the end 12a of the submount 12 and the end of the disposed position of the first bonding material 31 can be in a range of 0.1 mm to 1 mm. After placing the laser device 10, when the first bonding material 31 protrudes from the end 12a of the submount 12, a distance between the end 12a of the submount 12 and an end of the first bonding material 31 can be in a range of 0.05 mm to 0.5 mm.

Also, when the optical member 20 is mounted on the upper surface of the substrate 1, the optical member 20 can be held by the holding member and then pressed onto the substrate 1 via the second bonding material 32. After pressing the optical member 20, the holding member is separated from the optical member 20. The timing of separating the holding member is before heating the optical member 20 on the substrate 1. Accordingly, the air entering between the substrate 1 and the optical member 20 can be reduced, allowing for enhancing the bonding strength between the substrate 1 and the optical member 20. Also, after the optical member 20 is mounted, the second bonding material 32 may have a thickness in a range of 0.5 µm to 5 µm, or 0.5 µm to 80 µm.

When the optical member 20 is placed such that the end 20a of the optical member 20 that is to face the adjacent laser device 10 is located between the disposed position of the first bonding material 31 and the disposed position of the second bonding material 32, a distance between the end 20a of the optical member 20 and the end of the disposed position of the second bonding material 32 can be in a range of 0.35 mm to 2 mm.

For the holding member, for example, a die bonder, a mounter, or the like may be used.

In the laser package 100 shown in FIG. 4, the plurality of laser devices 10 are placed in rows and columns. Accordingly, any wiring in series or in parallel can be done easily.

Bonding Laser Device and Optical Member to Substrate

Then, heat is collectively applied to the laser devices 10 and the optical members 20 on the substrate 1 without pressing the plurality of laser devices 10 and one or more optical members 20 onto the substrate 1, so as to bond the plurality of laser devices 10 and the one or more optical members 20 to the substrate. Thus, the laser package 100 shown in FIG. 4 is obtained. The metal nanoparticles or the metal sub-micron particles spread less than that of a solder material, which can reduce possibility of misaligned bonding when the laser devices 10 and the optical devices 20 are heated for bonding to the substrate 1. Moreover, the laser devices 10 and the optical members 20 are not pressed to the substrate 1, so that even in the presence of a difference in heights between the laser device 10 and the optical member 20, and/or a difference in the sizes between the laser element 11 and the submount 12, uneven pressure is not applied on those components. Thus, while applying heat, there is a low possibility of shifting of the laser devices 10 and the optical member 20 from their bonding positions.

Further, the plurality of laser devices 10 and one or more optical members 20 are collectively bonded to the substrate 1, in other words, heating for bonding those components is applied only once. Thus, damage to the laser elements 11 caused by the heating can also be reduced. When each one of the plurality of laser devices 10 and each one of the optical members 20 are respectively pressed to the substrate 1 while applying heat so that those components are bonded to the substrate one by one, heat is applied to the entire substrate 1 at each bonding. Thus, damage to the laser elements 11 accumulate in the order of heating. Thus, when a plurality of laser devices 10 and a plurality of optical members 20 are bonded to the substrate 1, large damage to the laser elements 11 may result. However, in the present embodiment, the plurality of laser devices 10 and the one or more optical members 20 are bonded by a single heating. Thus, damage to the laser elements 11 can be the same degree as damage caused by heating a single laser device 10. For example, six or more of the laser devices 10 can be mounted on a single substrate 1.

The heating of the laser devices 10 and the optical members 20 can be conducted in a nitrogen atmosphere or in a vacuum. Thus, the organic solvent can be vaporized without deterioration by oxidation, and sintering of the metal nanoparticles or the metal sub-micron particles can be accelerated. As a result, generation of voids in an aggregate of the metal nanoparticles or the metal sub-micron particles after heating can be reduced. Thus, bonding strength between the substrate 1 and the laser devices 10 and between the substrate 1 and the optical members 20 can be enhanced.

The temperature of the heating the laser devices 10 and the optical members 20 can be in a range of 150 degrees to 250 degrees. Thus, the organic solvent can be vaporized to a degree not to cause accumulation of dust to the emission end surfaces of the laser elements 11 when emitting the laser package 100. The duration of applying heat can be in range of 20 minute to 40 minutes. Thus, the organic solvent can be vaporized to a degree not to cause accumulation of dust to the emission end surfaces of the laser elements 11 when emitting the laser package 100.

At the time of or after bonding the laser devices 10 and the optical members 20 to the substrate 1, the laser devices 10 and the optical members 20 disposed on the upper surface of the substrate 1 are preferably plasma treated. With this, residue of the organic solvent vaporized from the first bonding material 31 and the second bonding material 32 can be removed. As a result, as shown in FIG. 4, when wire bonding is performed to electrically connect the laser devices 10 and external electrodes 3 on the substrate 1 respectively, the bonding strength between the laser devices 10 and the wires 40 and between the external electrodes and the wires 40 can be enhanced. Further, accumulation of dust on the light emitting end surfaces of the laser elements 11 can be reduced, so that reliability of the laser elements 11 can be improved.

Figure 5:
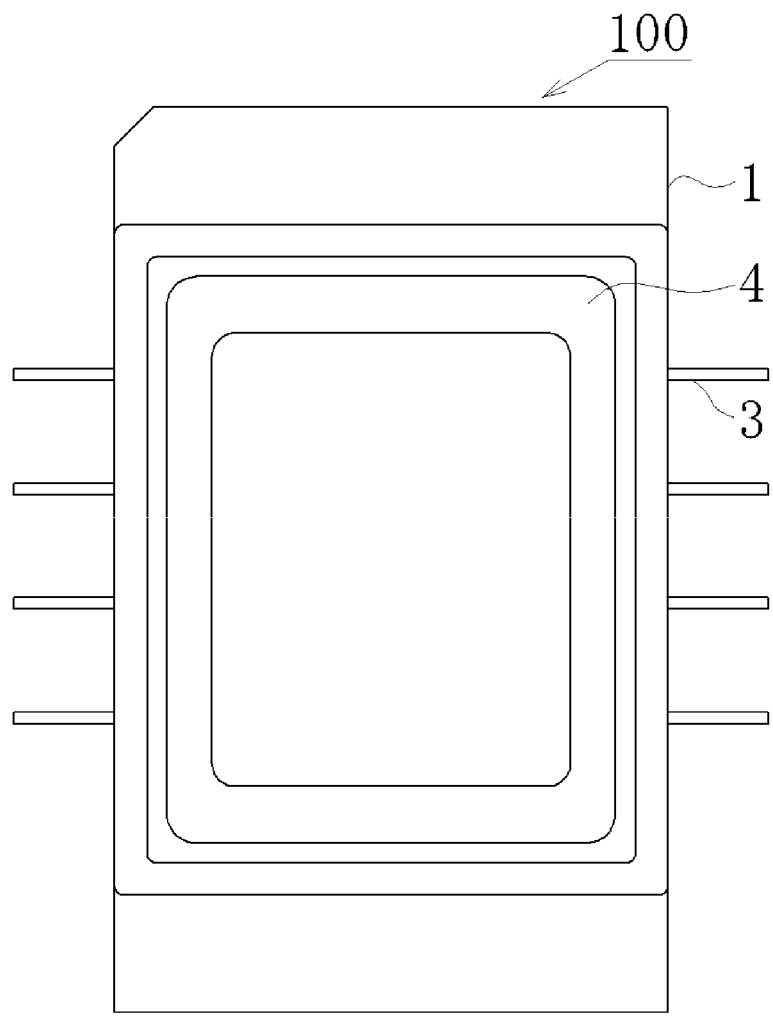
FIG. 5 is a schematic plan view of a laser package according to one embodiment of the present disclosure.

As shown in FIG. 5, after bonding the laser devices 10 and the optical members 20 to the substrate 1, the method may further include a step of sealing the laser devices 10 and the optical members 20 bonded to the substrate 1 by a cover body 4. The cover body 4 is preferably bonded to the substrate 1 so as to hermetically seal the laser devices 10 and other components. When the laser devices 10 are of high power output, the optical density is particularly high at and the vicinity of the light emitting surface of each of the laser elements 11. This collects dust, such as organic material or the like, but with such a hermetic sealing, accumulation of dust can be efficiently reduced. The cover body 4 has a light-transmissive member to allow light reflected by the optical members 20 to transmit therethrough.

It is to be understood that although embodiments of the present invention have been described, various other embodiments and variants may occur to those skilled in the art that are within the scope and spirit of the invention, and such other embodiments and variants are intended to be covered by the following claims.

What is claimed is:

1. A laser package comprising:
a substrate having an upper surface;
a first laser element disposed on the substrate and configured to emit light in a first direction;
a first optical member having a lower surface bonded to the upper surface of the substrate, a reflecting surface inclined relative to the lower surface and configured to reflect the light, and an upper surface connected to the reflecting surface, the upper surface of the first optical member being located farther in the first direction than the reflecting surface; and
a bonding material disposed on the upper surface of the substrate; wherein:
the first optical member is bonded to the substrate via the bonding material; and
in a top view, a portion of the bonding material protrudes from three sides of the upper surface of the first optical member.

2. The laser package according to the claim 1, wherein in a top view, the bonding material has a circle-like shape; and
in a top view, a center point of the circle-like shape overlaps the upper surface of the first optical member.

3. The laser package according to the claim 1, wherein:
the bonding material is a second bonding material; and
the laser package further comprises:
a first bonding material disposed on the upper surface of the substrate; and
a first submount bonded to the substrate via the first bonding material and having an upper surface on which the laser element is disposed; wherein:
in a top view, the first submount has a rectangular shape; and
in a top view, a portion of the first bonding material protrudes from four sides of the rectangular shape.

4. The laser package according to the claim 2, wherein:
the bonding material is a second bonding material; and
the laser package further comprises:
a first bonding material disposed on the upper surface of the substrate; and
a first submount bonded to the substrate via the first bonding material and having an upper surface on which the laser element is disposed; wherein:
in a top view, an area of the first bonding material is greater than an area of the second bonding material.

5. The laser package according to the claim 4, wherein:
in a top view, an area of the first optical member is greater than an area of the first submount.

6. The laser package according to the claim 2, wherein:
the first optical member is bonded to the substrate via a single portion of the bonding material.

7. The laser package according to the claim 1, wherein:
the bonding material contains metal nano-particles or metal sub-micron particles.

8. The laser package according to the claim 4, wherein:
the first optical member has a lateral surface connected to the lower surface and the reflecting surface, and
a height of the submount is greater than a distance between the lower surface of the first optical member and a lowermost edge of the reflecting surface.

9. The laser package according to the claim 1, further comprising:
a second laser element disposed on the substrate and configured to emit light in the first direction; and
an additional optical member having a lower surface bonded to the upper surface of the substrate, a reflecting surface inclined relative to the lower surface of the second optical member and configured to reflect the light emitted from the second laser element, and an upper surface connected to the reflecting surface, the upper surface of the first optical member being located farther in the first direction than the reflecting surface; wherein:
the second laser element is located farther in the first direction than the first optical member; and
the additional optical member is located farther in the first direction than the second laser element.

10. The laser package according to the claim 9, wherein:
a distance between the first laser element and the first optical member is less than a distance between the second laser element and the first optical member.

* * * * *